(12) United States Patent
Gaal et al.

(10) Patent No.: US 10,015,030 B2
(45) Date of Patent: Jul. 3, 2018

(54) WAVEFORM FOR TRANSMITTING WIRELESS COMMUNICATIONS

(71) Applicant: QUALCOMM Incorporated, San Diego, CA (US)

(72) Inventors: Peter Gaal, San Diego, CA (US); Tingfang Ji, San Diego, CA (US); Hao Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/979,332

(22) Filed: Dec. 22, 2015

(65) Prior Publication Data

US 2016/0182266 A1 Jun. 23, 2016

Related U.S. Application Data

(60) Provisional application No. 62/096,407, filed on Dec. 23, 2014.

(51) Int. Cl.
*H04L 27/20* (2006.01)
*H04L 27/26* (2006.01)
*H04L 27/34* (2006.01)
*H03M 13/25* (2006.01)

(52) U.S. Cl.
CPC ...... *H04L 27/2042* (2013.01); *H03M 13/256* (2013.01); *H04L 27/20* (2013.01); *H04L 27/2614* (2013.01); *H04L 27/2627* (2013.01); *H04L 27/3411* (2013.01)

(58) Field of Classification Search
CPC ............. H04L 27/2042; H04L 27/2614; H04L 27/3411; H04L 27/20; H04L 27/2626; H04L 27/2627; H04L 27/2035; H04L 27/2046; H04L 27/2071; H03M 13/256
USPC ................................ 375/265, 279, 280, 308
See application file for complete search history.

(56) References Cited

U.S. PATENT DOCUMENTS

| | | | | |
|---|---|---|---|---|
| 2002/0177995 | A1* | 11/2002 | Walker | G01R 23/16 704/205 |
| 2009/0245422 | A1* | 10/2009 | Sampath | H04L 27/2644 375/302 |
| 2010/0209115 | A1* | 8/2010 | Elahmadi | H04B 10/25137 398/147 |
| 2010/0238984 | A1* | 9/2010 | Sayana | H04B 7/0634 375/219 |

FOREIGN PATENT DOCUMENTS

EP 1267513 A2 12/2002

OTHER PUBLICATIONS

International Search Report and Written Opinion—PCT/US2015/000276—ISA/EPO—dated Sep. 21, 2016, p. 1-21.

(Continued)

*Primary Examiner* — Betsy Deppe
(74) *Attorney, Agent, or Firm* — Dalei Dong; Arent Fox LLP

(57) ABSTRACT

Various aspects described herein relate to generating a waveform for transmitting in wireless communications. A plurality of segments of a waveform are generated. An overlap-and-add is performed in at least a phase domain at one or more boundaries between the plurality of segments. The waveform can be transmitted.

36 Claims, 8 Drawing Sheets

(56) References Cited

OTHER PUBLICATIONS

Langton C., "Intuitive Guide to Principles of Communications, Trellis Coded Modulation (TCM)", Internet Citation, XP001539764, Jan. 1, 2004 (Jan. 1, 2004), 35 pages. Retrieved from the Internet: URL: http://www.complextoreal.com/chapters/tcm.pdf [retrieved on Mar. 5, 2010].
Freescale Semiconductor : "Spectral Mask Issues for the LTE Uplink", 3GPP Draft; R1-062186, 3rd Generation Partnership Project (3GPP), Mobile Competence Centre ; 650, Route Des Lucioles ; F-06921 Sophia-Antipolis Cedex ; France, vol. RAN WG1, No. Tallinn; Aug. 23, 2006, Aug. 23, 2006 (Aug. 23, 2006), XP050102724, [retrieved on Aug. 23, 2006], 6 pages.
Huawei: "Analysis of Out-of-band Spectrum Emission of Uplink Transmission under Current Numerology", 3GPP Draft; R1-061857, 3rd Generation Partnership Project (3GPP), Mobile Competence Centre ; 650, Route Des Lucioles ; F-06921 Sophia-Antipolis Cedex ; France, vol. RAN WG1, No. Cannes, France; Jun. 20, 2006, Jun. 20, 2006 (Jun. 20, 2006), XP050111673, [retrieved on Jun. 20, 2006].
Lucent Technologies et al., "Windowing and Spectral Containment for OFDM downlink," 3GPP Draft; R1-051203, 3rd Generation Partnership Project (3GPP), Mobile Competence Centre ; 650, Route Des Lucioles ; F-06921 Sophia-Antipolis Cedex ; France, vol. RAN WG1, No. San Diego, USA; Oct. 3, 2005, Oct. 3, 2005 (Oct. 3, 2005), XP050100804, [retrieved on Oct. 3, 2005], 12 pages.
Partial International Search Report—PCT/US2015/000276—ISA/EPO—dated May 19, 2016. 9 Total Pages.

\* cited by examiner

WAVEFORM FOR TRANSMITTING WIRELESS COMMUNICATIONS

CLAIM OF PRIORITY UNDER 35 U.S.C. § 119

The present application for patent claims priority to Provisional Application No. 62/096,407 entitled "WAVEFORM FOR TRANSMITTING WIRELESS COMMUNICATIONS" filed Dec. 23, 2014, which is assigned to the assignee hereof and hereby expressly incorporated by reference herein.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency divisional multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example of a telecommunication standard is Long Term Evolution (LTE). LTE is a set of enhancements to the Universal Mobile Telecommunications System (UMTS) mobile standard promulgated by Third Generation Partnership Project (3GPP). Generally, a wireless multiple-access communication system can simultaneously support communication for multiple wireless terminals (e.g., user equipment (UE)), each of which can communicate with one or more base stations over downlink or uplink resources.

Current devices generate uplink waveforms that can produce signals with high peak-to-average ratios, which can be burdensome for radio frequency (RF) resource utilization, can result in unpredictable symbol interference, and/or the like.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an example, a method for generating a waveform for transmitting in wireless communications is provided. The method includes generating a plurality of segments of a waveform, performing an overlap-and-add in at least a phase domain at one or more boundaries between the plurality of segments, and transmitting the waveform.

In another example, an apparatus for generating a waveform for transmitting in wireless communications is provided. The apparatus includes a transceiver, at least one processor communicatively coupled with the transceiver via a bus for communicating signals in a wireless network, and a memory communicatively coupled with the at least one processor and/or the transceiver via the bus. The at least one processor is operable to generate a plurality of segments of a waveform, perform an overlap-and-add in at least a phase domain at one or more boundaries between the plurality of segments, and transmit the waveform via the transceiver.

In yet another example, an apparatus for generating a waveform for transmitting in wireless communications is provided. The apparatus includes means for generating a plurality of segments of a waveform, means for performing an overlap-and-add in at least a phase domain at one or more boundaries between the plurality of segments, and means for transmitting the waveform.

In a further example, a computer-readable storage medium including computer-executable code for generating a waveform for transmitting in wireless communications is provided. The code includes code for generating a plurality of segments of a waveform, code for performing an overlap-and-add in at least a phase domain at one or more boundaries between the plurality of segments, and code for transmitting the waveform.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

In order to facilitate a fuller understanding of aspects described herein, reference is now made to the accompanying drawings, in which like elements are referenced with like numerals. These drawings should not be construed as limiting the present disclosure, but are intended to be illustrative only.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts. Moreover, in an aspect, a component may be generally understood to be one of the parts that make up a system, may be hardware or software, and/or may be divided into other components.

Described herein are various aspects related to generating waveforms for transmitting wireless communications where the waveforms represent an input stream of one of a plurality of bits, a reference signal or other defined signal, etc. To generate the waveform, a plurality of segments of the waveform can be generated, which may include one or more symbols single-carrier frequency division multiplexing (SC-FDM) symbols, orthogonal frequency division multiplexing (OFDM) symbols, etc. An overlap-and-add can be performed in at least a phase domain at boundaries between the segments to smoothen a transition among the segments. By performing the overlap-and-add in the phase domain, the amplitude of the signal can remain substantially constant among the segments, which can result in lower peak-to-average power ratio (PAPR) than when performing overlap-and-add over the other domains of the signal.

Figure 2:
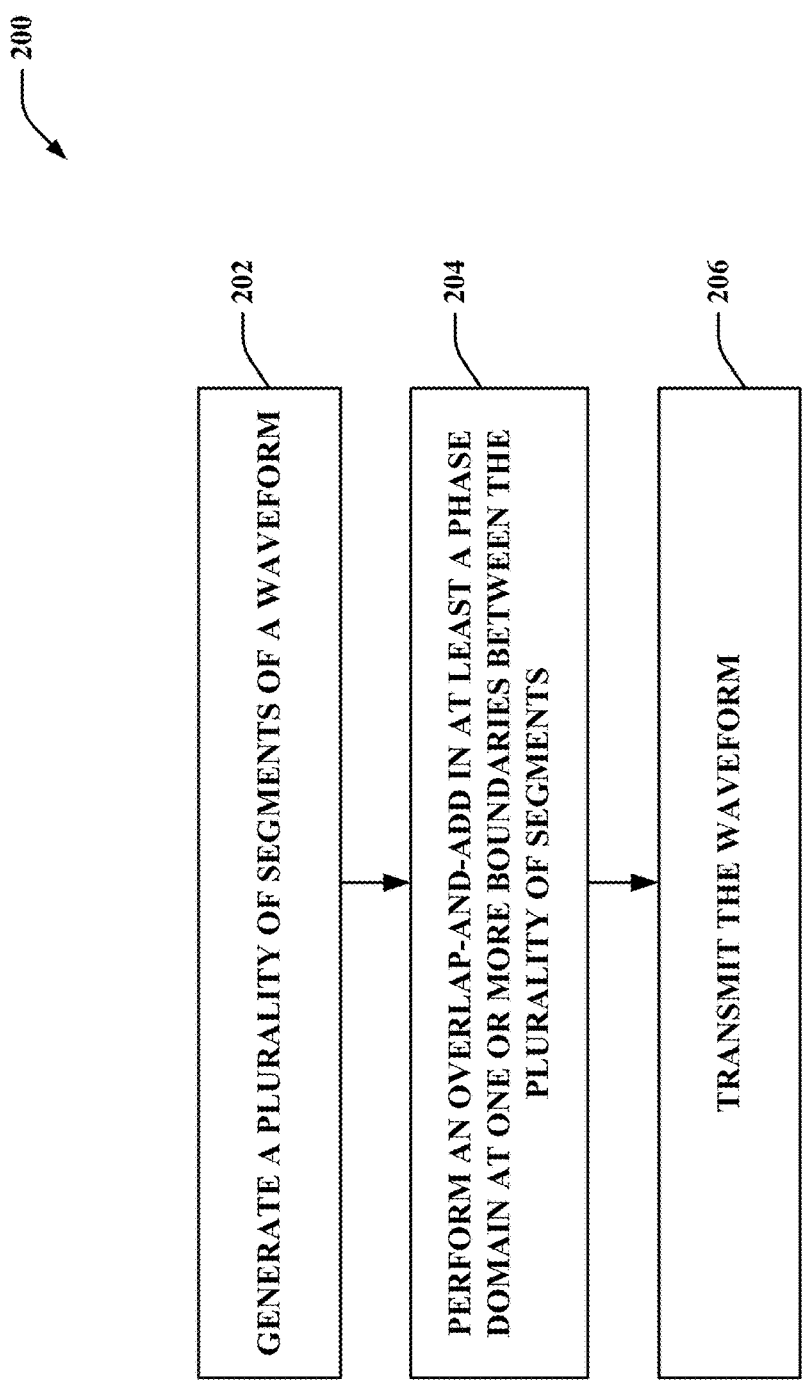
FIG. 2 is a flow diagram comprising a plurality of functional blocks representing an example method for generating a waveform in accordance with aspects described herein.
Figure 3:
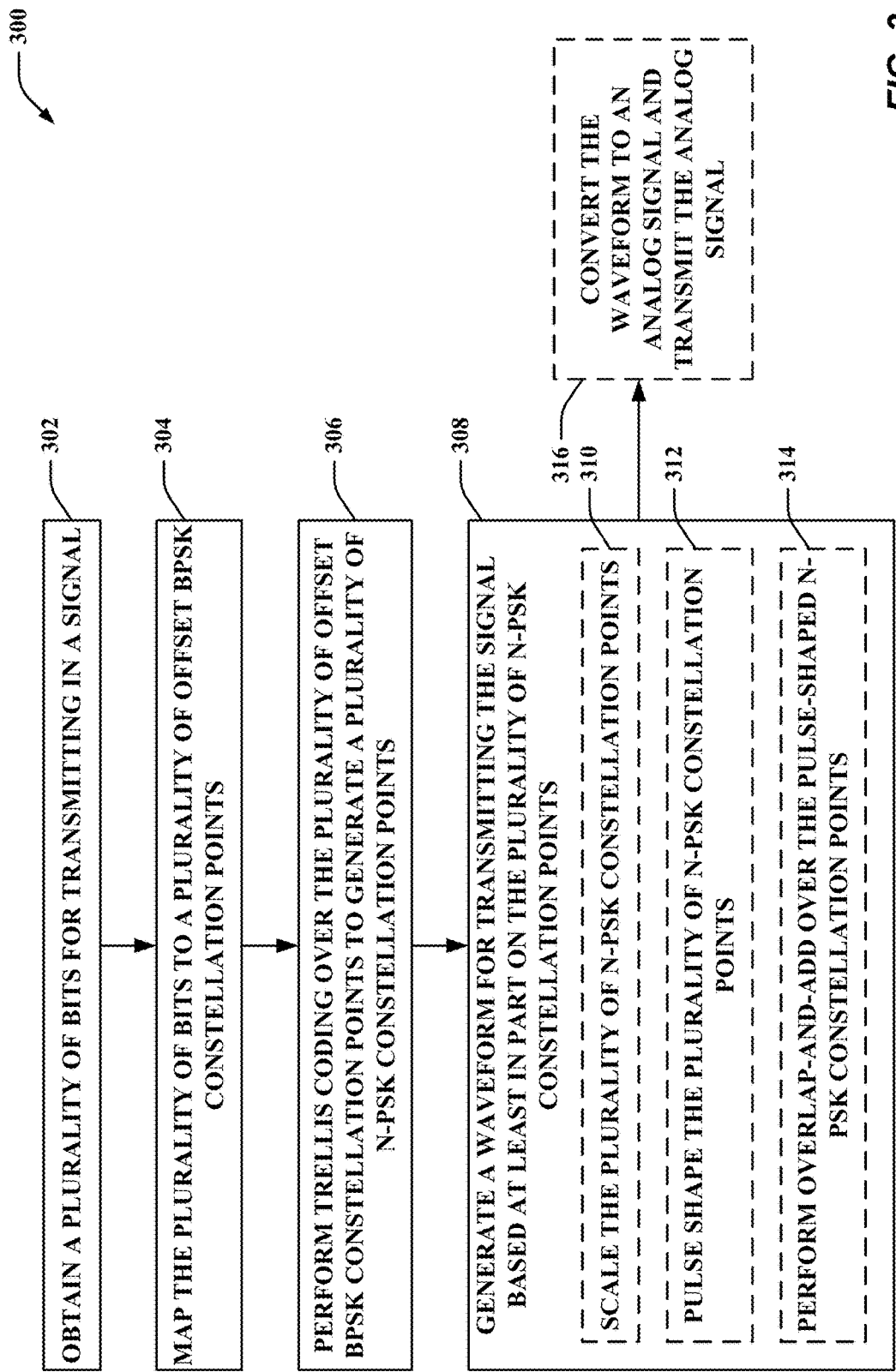
FIG. 3 is a flow diagram comprising a plurality of functional blocks representing an example method for generating a waveform in accordance with aspects described herein.
Figure 5:
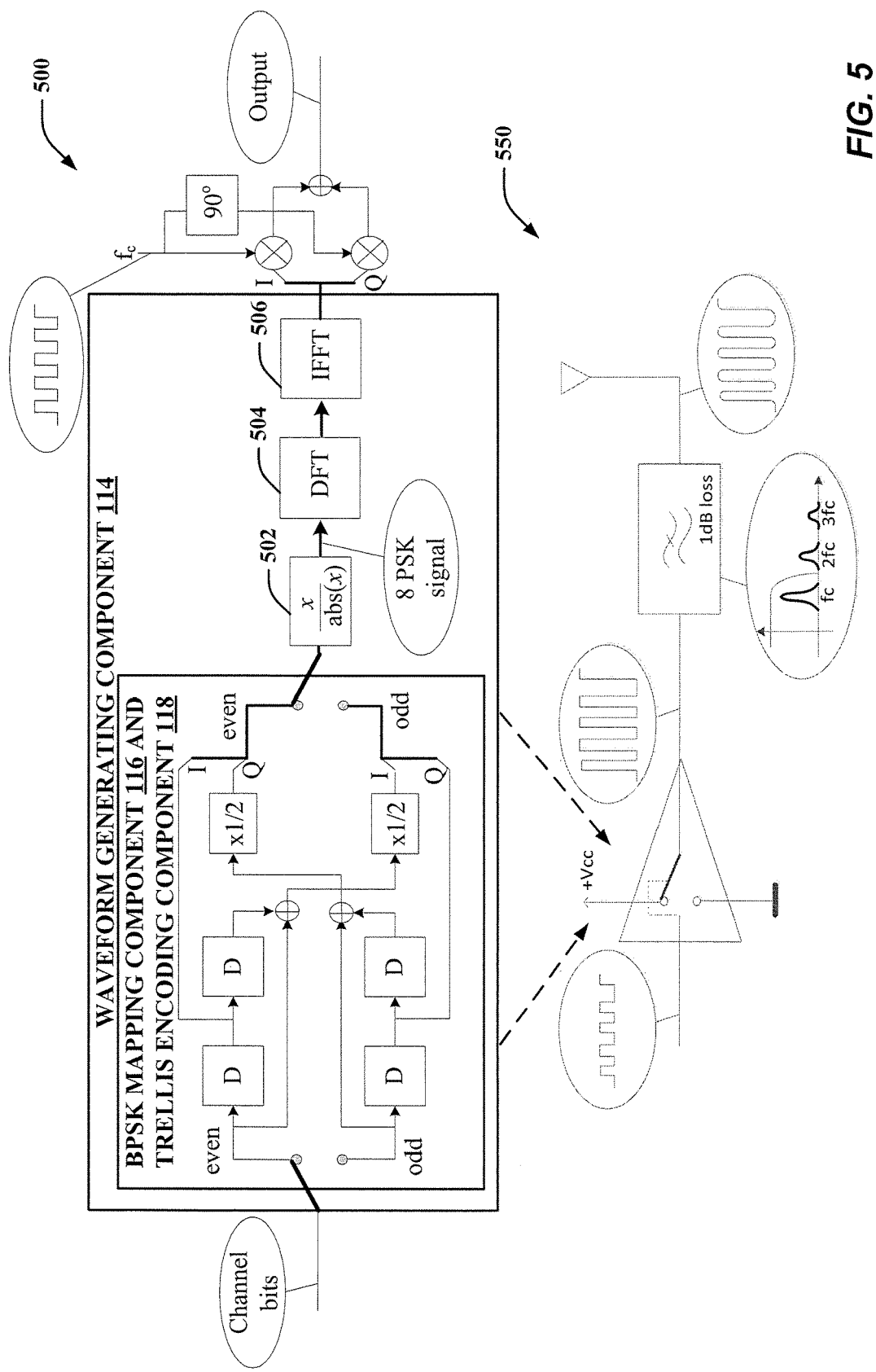
FIG. 5 is a block diagram conceptually illustrating example transmitters in accordance with aspects described herein.
Figure 6:
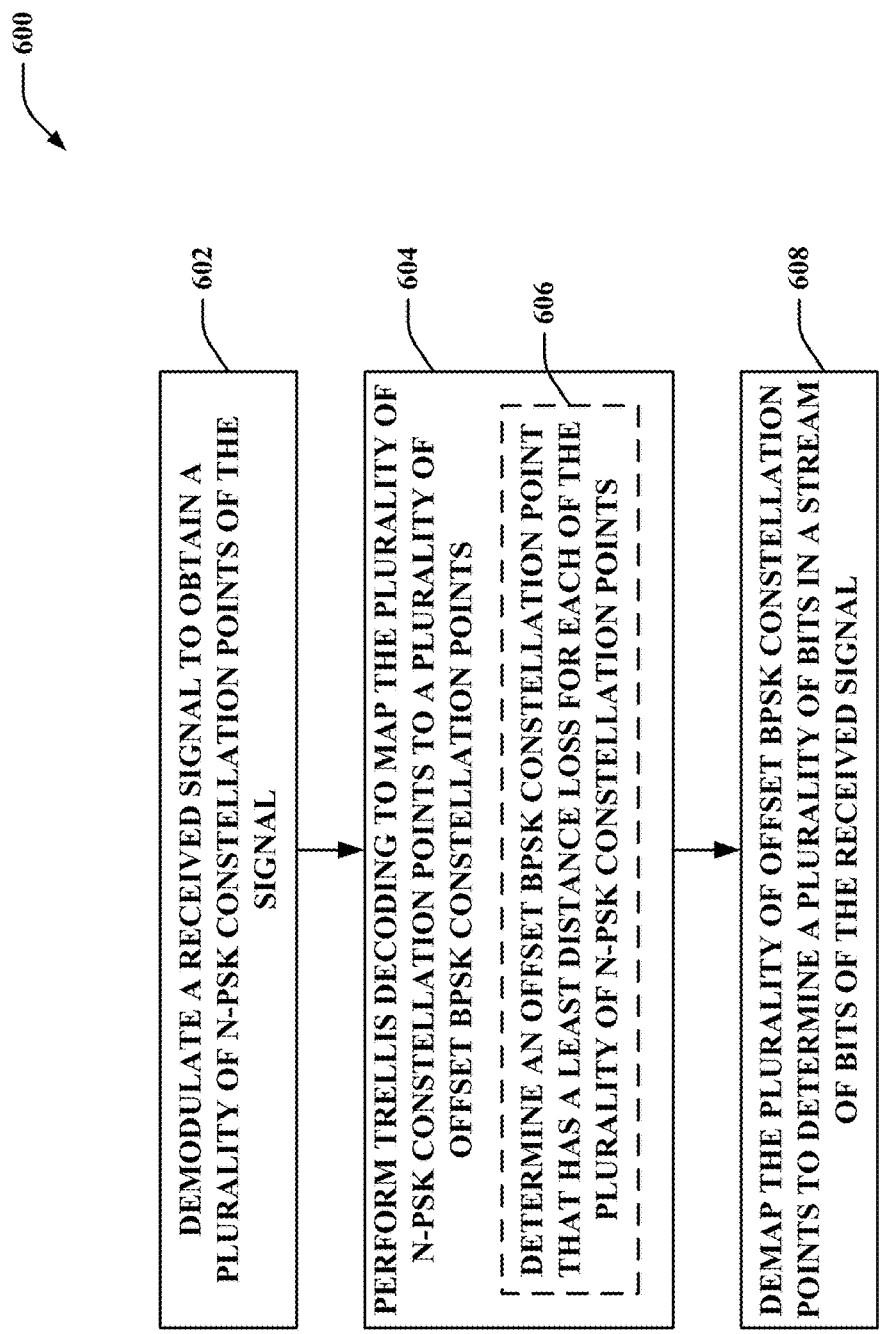
FIG. 6 is a flow diagram comprising a plurality of functional blocks representing an example method for decoding data from a waveform in accordance with aspects described herein.

In other examples, where the input stream corresponds to a plurality of bits, the plurality of bits are mapped to offset binary phase shift keying (BPSK) constellation points. Trellis coding is then performed over the BPSK constellation points to generate a plurality of higher order phase shift keying (PSK) (e.g., N-PSK, where N is an integer greater than 2) constellation points from the BPSK constellation points at least in part by selecting a higher order PSK constellation point for a given bit based on values of one or more preceding and/or succeeding bits. The waveform can then be generated based on the N-PSK constellation points for transmitting to one or more devices, which additionally results in a smoothened waveform than one generated from BPSK constellation points. In addition, the waveform can be scaled, power amplified, and/or pulse-shaped before converting to an analog signal for transmission. In an example, the bits can be received from a higher layer of a device (e.g., a media access control (MAC), radio link control (RLC), packet data convergence protocol (PDCP) or higher layer), at a lower layer (e.g., a physical (PHY) layer) for generating the waveform for transmission Referring to FIGS. 1-7, aspects are depicted with reference to one or more components and one or more methods that may perform the actions or functions described herein. Although the operations described below in FIGS. 2, 3, and 6 are presented in a particular order and/or as being performed by an example component, it should be understood that the ordering of the actions and the components performing the actions may be varied, depending on the implementation. Moreover, it should be understood that the following actions or functions may be performed by a specially-programmed processor, a processor executing specially-programmed software or computer-readable media, or by any other combination of a hardware component and/or a software component capable of performing the described actions or functions.

Figure 1:
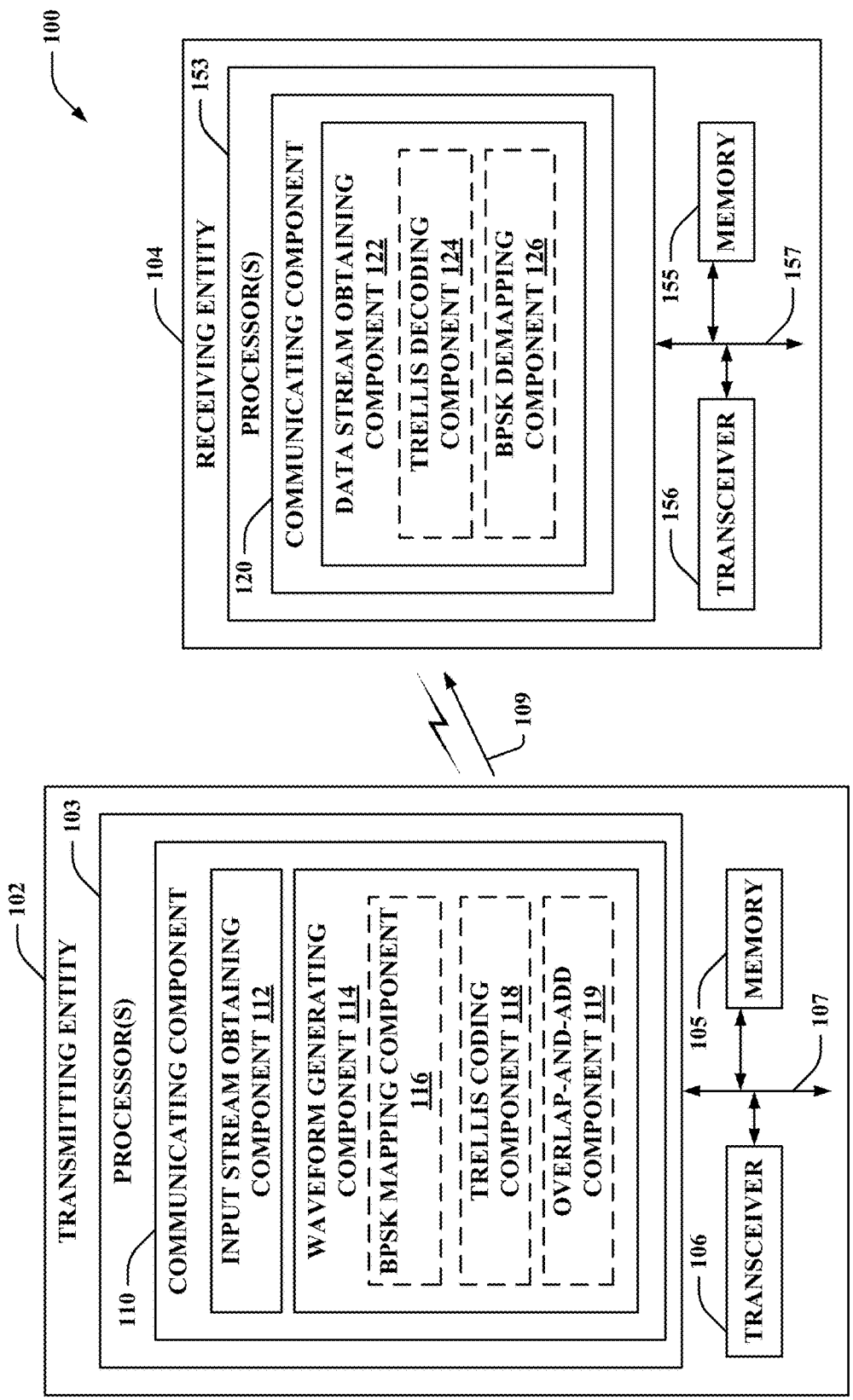
FIG. 1 is a block diagram illustrating an example wireless communications system for generating a waveform according to aspects described herein.

FIG. 1 is a schematic diagram illustrating a system 100 for wireless communication, according to an example configuration. System 100 includes a transmitting entity 102 that transmits signals to a receiving entity 104. In an example, transmitting entity 102 may be, or may include at least a portion of, a user equipment (UE) that transmit signals to receiving entity 104, which may be, or may include at least a portion of, an evolved Node B (eNB), to access a wireless network (and/or vice versa). Thus, in one example, transmitting entity 102 and receiving entity 104 may have established one or more channels over which to communicate via one or more signals 109, which can be transmitted by transmitting entity 102 (e.g., via transceiver 106) and received by receiving entity 104 (e.g., via transceiver 156). In addition, though one transmitting entity 102 and one receiving entity 104 are shown, it is to be appreciated that multiple transmitting entities 102 can communicate with a receiving entity 104, a transmitting entity 102 can communicate with multiple receiving entities 104, and/or the like. In addition, it is to be appreciated that receiving entity 104 may also include the components for performing the functions of transmitting entity 102 described below for transmitting communications, in one example.

In an aspect, transmitting entity 102 may include one or more processors 103 and/or a memory 105 that may be communicatively coupled, e.g., via one or more buses 107, and may operate in conjunction with or otherwise implement a communicating component 110 for managing communications with receiving entity 104. For example, the various operations related to communicating component 110 may be implemented or otherwise executed by one or more processors 103 and, in an aspect, can be executed by a single processor, while in other aspects, different ones of the operations may be executed by a combination of two or more different processors. For example, in an aspect, the one or more processors 103 may include any one or any combination of a modem processor, or a baseband processor, or a digital signal processor, or an application specific integrated circuit (ASIC), or a transmit processor, receive processor, or a transceiver processor associated with transceiver 106. Further, for example, the memory 105 may be a non-transitory computer-readable medium that includes, but is not limited to, random access memory (RAM), read only memory (ROM), programmable ROM (PROM), erasable PROM (EPROM), electrically erasable PROM (EEPROM), a magnetic storage device (e.g., hard disk, floppy disk, magnetic strip), an optical disk (e.g., compact disk (CD), digital versatile disk (DVD)), a smart card, a flash memory device (e.g., card, stick, key drive), a register, a removable disk, and any other suitable medium for storing software and/or computer-readable code or instructions that may be accessed and read by a computer or one or more processors 103. Moreover, memory 105 or computer-readable storage medium may be resident in the one or more processors 103, external to the one or more processors 103, distributed across multiple entities including the one or more processors 103, etc.

In particular, the one or more processors 103 and/or memory 105 may execute actions or operations defined by communicating component 110 or its subcomponents. For instance, the one or more processors 103 and/or memory 105 may execute actions or operations defined by an input stream obtaining component 112 for receiving an input stream of bits from higher layers for communicating to a receiving entity. In an aspect, for example, input stream obtaining component 112 may include hardware (e.g., one or more processor modules of the one or more processors 103) and/or computer-readable code or instructions stored in memory 105 and executable by at least one of the one or more processors 103 to perform the specially configured input stream obtaining operations described herein. Further, for instance, the one or more processors 103 and/or memory 105 may execute actions or operations defined by a waveform generating component 114 for generating a waveform for transmitting a signal to the receiving entity based on the input stream of bits. In an aspect, for example, waveform generating component 114 may include hardware (e.g., one or more processor modules of the one or more processors 103) and/or computer-readable code or instructions stored in memory 105 and executable by at least one of the one or more processors 103 to perform the specially configured waveform generating operations described herein.

Further, for instance, the one or more processors 103 and/or memory 105 may optionally execute actions or operations defined by an optional BPSK mapping component 116 for mapping the input stream of bits to offset BPSK constellation points in a given symbol. In an aspect, for example, BPSK mapping component 116 may include hardware (e.g., one or more processor modules of the one or more processors 103) and/or computer-readable code or instructions stored in memory 105 and executable by at least one of the one or more processors 103 to perform the specially configured BPSK mapping operations described herein. Further, for instance, the one or more processors 103 and/or memory 105 may optionally execute actions or operations defined by an optional trellis coding component 118 for performing trellis coding on the offset BPSK constellation points to generate N-PSK constellation points, where N is an integer greater than two. In an aspect, for example, trellis coding component 118 may include hardware (e.g., one or more processor modules of the one or more processors 103) and/or computer-readable code or instructions stored in memory 105 and executable by at least one of the one or more processors 103 to perform the specially configured trellis coding operations described herein. Further, for instance, the one or more processors 103 and/or memory 105 may optionally execute actions or operations defined by an optional overlap-and-add component 119 for performing an overlap-and-add operation on one or more segments of the input stream to smooth transitions among the one or more segments. In an aspect, for example, overlap-and-add component 119 may include hardware (e.g., one or more processor modules of the one or more processors 103) and/or computer-readable code or instructions stored in memory 105 and executable by at least one of the one or more processors 103 to perform the specially configured overlap-and-add operations described herein Similarly, in an aspect, receiving entity 104 may include one or more processors 153 and/or a memory 155 that may be communicatively coupled, e.g., via one or more buses 157, and may operate in conjunction with or otherwise implement a communicating component 120 for managing communications with the transmitting entity 102. For example, the various functions related to communicating component 120 may be implemented or otherwise executed by one or more processors 153 and, in an aspect, can be executed by a single processor, while in other aspects, different ones of the functions may be executed by a combination of two or more different processors, as described above. It is to be appreciated, in one example, that the one or more processors 153 and/or memory 155 may be configured as described in examples above with respect to the one or more processors 103 and/or memory 105 of transmitting entity 102.

In an example, the one or more processors 153 and/or memory 155 may execute actions or operations defined by communicating component 120 or its subcomponents. For instance, the one or more processors 153 and/or memory 155 may execute actions or operations defined by a data stream obtaining component 122 for obtaining a data stream from a signal received from transmitting entity 102, which can be provided to higher layers for processing. In an aspect, for example, data stream obtaining component 122 may include hardware (e.g., one or more processor modules of the one or more processors 153) and/or computer-readable code or instructions stored in memory 155 and executable by at least one of the one or more processors 153 to perform the specially configured data stream obtaining operations described herein. Further, for instance, the one or more processors 153 and/or memory 155 may execute actions or operations defined by an optional trellis decoding component 124 for performing trellis decoding on a demodulated signal received from transmitting entity 102 to generate a plurality of offset BPSK constellation points from a plurality of N-PSK constellation points in the demodulated signal. In an aspect, for example, trellis decoding component 124 may include hardware (e.g., one or more processor modules of the one or more processors 153) and/or computer-readable code or instructions stored in memory 155 and executable by at least one of the one or more processors 153 to perform the specially configured trellis coding operations described herein. Further, for instance, the one or more processors 153 and/or memory 155 may execute actions or operations defined by an optional BPSK demapping component 126 for demapping the offset BPSK constellation points to generate a plurality of bits in a stream of bits of the received signal. In an aspect, for example, BPSK demapping component 126 may include hardware (e.g., one or more processor modules of the one or more processors 153) and/or computer-readable code or instructions stored in memory 155 and executable by at least one of the one or more processors 153 to perform the specially configured BPSK demapping operations described herein.

It is to be appreciated that transceivers 106, 156 may be configured to transmit and receive wireless signals through one or more antennas, an RF front end, one or more transmitters, and one or more receivers. In an aspect, transceivers 106, 156 may be tuned to operate at specified frequencies such that transmitting entity 102 and receiving entity 104 can communicate at a certain frequency. In an aspect, the one or more processors 103 may configure transceiver 106 and/or one or more processors 153 may configure transceiver 156 to operate at a specified frequency and power level based on a configuration, a communication protocol, etc. to communicate signals 109.

In an aspect, transceivers 106, 156 can operate in multiple bands (e.g., using a multiband-multimode modem, not shown) such to process digital data sent and received using transceivers 106, 156. In an aspect, transceivers 106, 156 can be multiband and be configured to support multiple frequency bands for a specific communications protocol. In an aspect, transceivers 106, 156 can be configured to support multiple operating networks and communications protocols. Thus, for example, transceivers 106, 156 may enable transmission and/or reception of signals based on a specified modem configuration.

Where transmitting entity 102 or receiving entity 104 is a UE, the UE may comprise any type of mobile device, such as, but not limited to, a smartphone, cellular telephone, mobile phone, laptop computer, tablet computer, or other portable networked device that can be a standalone device, tethered to another device (e.g., a modem connected to a computer), a watch, a personal digital assistant, a personal monitoring device, a machine monitoring device, a machine to machine communication device, etc. In addition, a UE may also be referred to by those skilled in the art as a mobile station, a subscriber station, a mobile unit, a subscriber unit, a wireless unit, a remote unit, a mobile device, a mobile communications device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology. In general, a UE may be small and light enough to be considered portable and may be configured to communicate wirelessly via an over-the-air communication link using one or more OTA communication protocols described herein. Additionally, in some examples, a UE may be configured to facilitate communication on multiple separate networks via multiple separate subscriptions, multiple radio links, and/or the like.

Furthermore, where transmitting entity 102 or receiving entity 104 is a network entity, the network entity may comprise one or more of any type of network module, such as an access point, a macro cell, including a base station (BS), node B, eNodeB (eNB), a relay, a peer-to-peer device, an authentication, authorization and accounting (AAA) server, a mobile switching center (MSC), a mobility management entity (MME), a radio network controller (RNC), a small cell, etc. As used herein, the term "small cell" may refer to an access point or to a corresponding coverage area of the access point, where the access point in this case has a relatively low transmit power or relatively small coverage as compared to, for example, the transmit power or coverage area of a macro network access point or macro cell. For instance, a macro cell may cover a relatively large geographic area, such as, but not limited to, several kilometers in radius. In contrast, a small cell may cover a relatively small geographic area, such as, but not limited to, a home, a building, or a floor of a building. As such, a small cell may include, but is not limited to, an apparatus such as a BS, an access point, a femto node, a femtocell, a pico node, a micro node, a Node B, eNB, home Node B (HNB) or home evolved Node B (HeNB). Therefore, the term "small cell," as used herein, refers to a relatively low transmit power and/or a relatively small coverage area cell as compared to a macro cell. Additionally, a network entity may communicate with one or more other network entities of wireless and/or core networks Additionally, system 100 may include any network type, such as, but not limited to, wide-area networks (WAN), wireless networks (e.g. 802.11 or cellular network), the Public Switched Telephone Network (PSTN) network, ad hoc networks, personal area networks (e.g. Bluetooth®) or other combinations or permutations of network protocols and network types. Such network(s) may include a single local area network (LAN) or wide-area network (WAN), or combinations of LANs or WANs, such as the Internet. Such networks may comprise a Wideband Code Division Multiple Access (W-CDMA) system, and may communicate with one or more UEs according to this standard. As those skilled in the art will readily appreciate, various aspects described herein may be extended to other telecommunication systems, network architectures and communication standards. By way of example, various aspects may be extended to other Universal Mobile Telecommunications System (UMTS) systems such as Time Division Synchronous Code Division Multiple Access (TD-SCDMA), High Speed Downlink Packet Access (HSDPA), High Speed Uplink Packet Access (HSUPA), High Speed Packet Access Plus (HSPA+) and Time-Division CDMA (TD-CDMA). Various aspects may also be extended to systems employing Long Term Evolution (LTE) (in frequency division duplexing (FDD), time division duplexing (TDD), or both modes), LTE-Advanced (LTE-A) (in FDD, TDD, or both modes), CDMA2000, Evolution-Data Optimized (EV-DO), Ultra Mobile Broadband (UMB), Institute of Electrical and Electronics Engineers (IEEE) 802.11 (Wi-Fi), IEEE 802.16 (WiMAX®), IEEE 802.20, Ultra-Wideband (UWB), Bluetooth, and/or other suitable systems. The actual telecommunication standard, network architecture, and/or communication standard employed will depend on the specific application and the overall design constraints imposed on the system. The various devices coupled to the network(s) (e.g., transmitting entity 102 and/or receiving entity 104) may be coupled to a core network via one or more wired or wireless connections.

FIG. 2 illustrates an example method 200 for generating, by a UE, a waveform in wireless communications. Method 200 includes, at block 202, generating a plurality of segments of a waveform. In an aspect, waveform generating component 114, e.g., in conjunction with processor(s) 103 and/or memory 105, can generate the plurality of segments of the waveform. For example, input stream obtaining components 112 can receive an input stream from which the waveform is to be generated, and waveform generating component 114 can generate the one or more segments, which may be consecutive segments, of the waveform based on the input stream In one example, the segments may correspond to a series of successive symbols (e.g., SC-FDM symbols, OFDM symbols, etc.). In some examples, the input stream may correspond to a plurality of bits of data received from a higher layer, as described further herein, and waveform generating component 114 can generate the one or more segments as one or more symbols based on the data bits. Similarly, in an example, the input stream may correspond to reference signals (e.g. pilot signals, synchronization signals, etc.) or other defined signals, and waveform generating component 114 can generate the one or more segments as one or more symbols corresponding to the reference signals or other signals. In an example, waveform generating component 114 may generate the one or more segments of the waveform based on any type of input stream to be transmitted as a signal in wireless communications.

When the one or more segments (e.g., symbols) are combined as consecutive segments to generate the waveform, there may be discontinuity at the boundary where each of the one or more segments are combined as these segments are processed independently. In this regard, for example, method 200 may include, at block 204, performing an overlap-and-add in at least a phase domain at one or more boundaries between the plurality of segments. In an aspect, overlap-and-add component 119, e.g., in conjunction with processor(s) 103 and/or memory 105, can perform the overlap-and-add in at least the phase domain at the one or more boundaries between the plurality of segments. By performing overlap-and-add in the phase domain, a substantially constant amplitude property can be maintained, which can achieve a low PAPR (or at least prevent significant increase in PAPR).

For example, overlap-and-add component 119 can perform the overlap-and-add by creating a period of overlap between two consecutive segments of the input stream, either by reducing the time separation between consecutive segments, or by a redundant extension of one or both segments (e.g. involving cyclic prefixes). The period of overlap can be short when compared to the duration of a segment. Then overlap-and-add component 119 can apply windowing functions in the period of overlap. The windowing function applied to the first overlapped segment may roll off (e.g., end) while the windowing function applied to the second segment may rise (e.g., start) at the same or similar time to facilitate a smooth transition from one segment to the next in generating the waveform. Appropriate windowing functions may include, for example raised cosine or root raised cosine. Overlap-and-add component 119 can apply such overlap-and-add functions advantageously in conjunction with the various aspects related to generating waveforms for transmitting wireless communications described herein. When performing overlap-and-add in the phase domain, for example, the windowing function is applied to the signal phase.

While in existing implementations of the overlap-and-add function, the windowing functions are applied as real scaling to the real or complex valued signals, overlap-and-add component 119 may, for example, apply the windowing functions to the signal phase to preserve the very low peak-to-average power ratio values. Thus, for example, the signal after the windowing function may have approximately the same amplitude as either of the overlapped samples, or an appropriate average of the overlapped samples, while the phase of the signal after the windowing function may be a weighted average of the phase of the overlapped signals, as described. Overlap-and-add component 119 may use windowing functions in this regard to determine the combining weights.

In another example, overlap-and-add component 119 may apply overlap-and-add windowing functions independently to the signal amplitude domain and/or signal magnitude domain of the overlapped signals and the phase of the overlapped signals. The windowing functions applied to the amplitude/magnitude and phase may be the same or they may different.

Method 200 may also include, at block 206, transmitting the waveform. In an aspect, communicating component 110, e.g., in conjunction with processor(s) 103, memory 105, and/or transceiver 106, can transmit the waveform as generated. For example, as described further herein, this may include converting the waveform to an analog signal and transmitting the analog signal using radio frequency (RF) components.

FIG. 3 illustrates an example method 300 for generating, e.g., by a transmitting entity, a waveform for an input stream of bits for transmission to one or more wireless devices. Method 300 includes, at block 302, obtaining a plurality of bits for transmitting in a signal. In an aspect, input stream obtaining component 112, e.g., in conjunction with processor(s) 103 and/or memory 105, can obtain the plurality of bits for transmitting in the signal. For example, input stream obtaining component 112 can obtain the plurality of bits from a higher layer, such as a MAC layer or higher layer, as corresponding to a data unit for the layer (e.g., a MAC protocol data unit (PDU)) for transmitting in a signal based on a waveform that corresponds to the plurality of bits at a lower layer (e.g., a PHY layer) in a communication stack.

Figure 4:
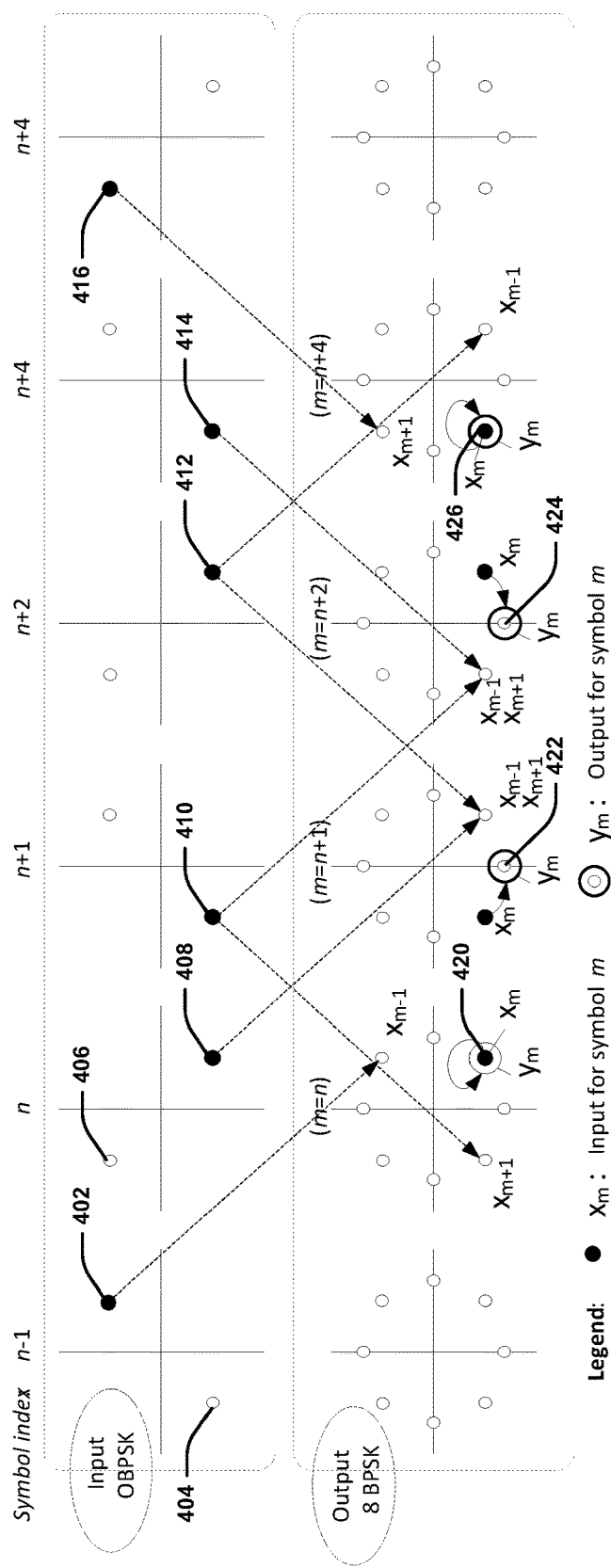
FIG. 4 is a diagram illustrating an example of performing trellis coding in accordance with aspects described herein.

Method 300 also includes, at block 304, mapping the plurality of bits to a plurality of offset BPSK constellation points. In an aspect, BPSK mapping component 116, e.g., in conjunction with processor(s) 103 and/or memory 105, can map the plurality of bits to the plurality of offset BPSK constellation points. An example is depicted in FIG. 4 where for each symbol index, one of two offset BPSK (OBPSK) constellation points are selected to represent the corresponding data based on the bit value. For example, for symbol index n−1, one of constellation points 402 and 404 are selected to represent the bit data (e.g., based on whether the bit value for the symbol is 0 or 1). In this example, constellation point 402 is selected by the BPSK mapping component 116. For the next symbol, n, the two available constellation points in offset BPSK are changed with respect to the constellation such that the same constellation point cannot be selected for consecutive symbols. Accordingly, two constellation points 406 and 408 are available for selecting based on the bit value for the data, and in symbol n, BPSK mapping component 116 selects constellation point 408 in the depicted example. In subsequent symbol n+1, the two available constellation points in offset BPSK are changed again (and are the same as in symbol n−1). BPSK mapping component 116 selects constellation point 410 in this symbol, constellation point 412 in symbol n+2, and constellation point 414 in symbol n+3, in the depicted example. It is to be appreciated that the series of selected offset BPSK constellation points can be used to generate a waveform representative of the constellation points for transmission, which can be decoded by the receiving entity to determine the data represented by the BPSK constellation points, as described herein.

Method 300 also includes, at block 306 performing trellis coding over the plurality of offset BPSK constellation points to generate a plurality of N-PSK constellation points. In an aspect, trellis coding component 118, e.g., in conjunction with processor(s) 103 and/or memory 105, can perform the trellis coding over the plurality of offset BPSK constellation points to generate a plurality of N-PSK constellation points. As described further below, trellis coding component 118 can perform the trellis coding by mapping each of the plurality of BPSK constellation points to one of three possible N-PSK constellation points where the selection of the one of three possible N-PSK constellation points is based at least in part on three consecutive BPSK constellation points (e.g., an input BPSK constellation point corresponding to an input bit, a preceding BPSK constellation point corresponding to a preceding input bit, and a succeeding BPSK constellation point corresponding to a succeeding input bit). An example is depicted in FIG. 4 where for each symbol index, n, the BPSK constellation points are mapped to one of a plurality of additional BPSK constellation points (e.g., one of N BPSK constellation points where N=8 in FIG. 4). For example, for a given symbol index, trellis coding component 118 determines an output symbol (represented as Ym for symbol m) by either maintaining the BPSK constellation point, denoted Xm for symbol m=n, or moving the BPSK constellation point to a next or previous N-PSK constellation point based the BPSK constellation points in the preceding and succeeding symbols (e.g., based on the preceding/succeeding bit input values, represented respectively as $X_{m-1}$ and $X_{m+1}$ for symbols m−1 and m+1).

In a specific example, trellis coding component 118 can maintain an input BPSK constellation point as the N-PSK constellation point in the trellis coding where the preceding BPSK constellation point preceding the input BPSK constellation point (e.g., the previous BPSK constellation point) is not the same point in the constellation as (e.g., does not have the same value as) the succeeding BPSK constellation point succeeding the input BPSK constellation point (e.g., the BPSK constellation point in the next symbol). In this example, trellis coding component 118 can select a different N-PSK constellation point for the input BPSK constellation point in the trellis coding where the preceding BPSK constellation point preceding the input BPSK constellation point is the same point in the constellation as (e.g., has the same value as) the succeeding BPSK constellation point succeeding the input BPSK constellation point. For example, the different N-PSK constellation point in this example can be the N-PSK constellation point that is between the input BPSK constellation point and the preceding/succeeding BPSK constellation point.

Thus, for example, in symbol n, trellis coding component 118 maintains the offset BPSK constellation point 408 for the trellis-coded N-PSK constellation point 420 because the offset BPSK constellation points 402 and 410 in symbols n−1 and n+1, respectively, are different. In symbol n+1, trellis coding component 118 shifts the offset BPSK constellation point 410 to the trellis-coded N-PSK constellation point 422 because the offset BPSK constellation points 408 and 412 in symbols n and n+2, respectively, are the same. In this example, trellis coding component 118 shifts to the trellis-coded N-PSK constellation point 422 that is one point closer to the BPSK constellation points 408 and 412 in the constellation. In symbol n+2, trellis coding component 118 shifts the offset BPSK constellation point 412 to the trellis-coded N-PSK constellation point 424 because the offset BPSK constellation points 410 and 414 in symbols n+1 and n+3, respectively, are the same. In this example, trellis coding component 118 shifts to the trellis-coded N-PSK constellation point 424 that is one point closer to the BPSK constellation points 410 and 414. In symbol n+3, trellis coding component 118 maintains the offset BPSK constellation point 414 for the trellis-coded N-PSK constellation point 426 because the offset BPSK constellation points 412 and 416 in symbols n+2 and n+4, respectively, are different. Generating a waveform from the trellis-coded 8-PSK constellation points can result in a smoother waveform than using offset BPSK, which minimizes peaks in the resulting signal (and thus minimizes peak-to-average ratio). Moreover, though 8-PSK is explicitly depicted for the trellis coding, it is to be appreciated that substantially any value of N-PSK can be used to balance a desired peak-to-average ratio with processing efficiency of converting the offset BPSK to N-PSK.

Additionally, in a specific example in performing trellis coding, trellis coding component 118 may use a circular tail-biting encoding within a given SC-FDM symbol. In this specific example, for determining the trellis-coded N-PSK last constellation point corresponding to a last bit (e.g., in the SC-FDM symbol), trellis coding component 118 can utilize the offset BPSK constellation point of the first bit as the n+1 constellation point (and/or additional constellation points if more offset BPSK constellation points are used in trellis codings for other values of N). This may ensure that there is no discontinuity at the beginning or end of an SC-FDM symbol. Such discontinuity, if existed, may give rise to undesirable peak-to-average power ratio increases after DFT and IFFT based processing.

Method 300 further includes, at block 308, generating a waveform for transmitting the signal based at least in part on the plurality of N-PSK constellation points. In an aspect, waveform generating component 114, e.g., in conjunction with processor(s) 103 and/or memory 105, can generate the waveform for transmitting the signal based at least in part on the plurality of N-PSK constellation points. For example, transceiver 106, or a portion thereof, can utilize the N-PSK constellation points to modulate and transmit the signal, as further described herein. Moreover, in an example, generating the waveform at block 308 may optionally include, at block 310, scaling the plurality of N-PSK constellation points. For example, waveform generating component 114 can scale (e.g., power amplify) the N-PSK constellation points in generating the waveform to achieve a desired range of point values. This may be based on one or more power commands received from the receiving entity 104 to control (e.g., increase and/or decrease) transmission power. In addition, for example, generating the waveform at block 308 may optionally include, at block 312, pulse shaping the plurality of N-PSK constellation points. For example, waveform generating component 114 can pulse shape the plurality of N-PSK constellation points in generating the waveform, which may include applying a discrete Fourier transform (DFT) or an inverse fast Fourier transform (IFFT) to the waveform. In an aspect, generating the plurality of segments at block 202 of FIG. 2 may include one or more of blocks 302, 304, 306, 308, 310, 312, etc. such that the input stream from which the plurality of segments are generated may be the plurality of bits, a plurality of offset BPSK constellation points, a plurality of N-PSK constellation points, segments of the waveform generated at block 308, scaled N-PSK constellation points, pulse-shaped N-PSK constellation points, etc. Moreover, as described, the input stream from which the plurality of segments are generated may include certain reference signals or other signals.

In addition, in an example, generating the waveform at block 308 may optionally include, at block 314, performing an overlap-and-add over the pulse-shaped N-PSK constellation points. In an example, overlap-and-add component 119 can perform an overlap-and-add operation over the pulse-shaped N-PSK constellation points relating to different segments of the stream of bits, as described. Moreover, as described, the overlap-and-add component 119 can perform the overlap-and-add in at least the phase domain and/or the signal amplitude domain and/or signal magnitude domain of the overlapped signals. The windowing functions applied to the amplitude/magnitude and phase may be the same or they may different.

Method 300 may also optionally include, at block 316, converting the waveform to an analog signal and transmitting the analog signal. In an aspect, communicating component 110, e.g., in conjunction with processor(s) 103, memory 105, and/or transceiver 106, may convert the waveform to an analog signal and transmit the analog signal (e.g., signal 109). FIG. 5 illustrates example configurations of transmitters 500 and 550 that can utilize the concepts described herein to generate signals having low peak-to-average ratio. For example, transmitter 500 can include waveform generating component 114 that receives channel bits, and BPSK mapping component 116 and trellis coding component 118 for generating trellis-coded constellation points from offset BPSK constellation points corresponding to the channel bits, as described above. Waveform generating component 114 also includes a scaler 502 to scale the waveform generated from the trellis-coded N-PSK constellation points, and a DFT 504 and IFFT 506 to pulse shape the signal before transmitting. Transmitter 550 can similarly include the described waveform generating component 114 as shown to receive channel bits and produce trellis-coded constellation points in a corresponding waveform for transmission.

FIG. 6 illustrates an example method 600 for determining (e.g., by a receiving entity 104) a plurality of bits in a stream of bits for a received signal. Method 600 includes, at block 602, demodulating a received signal to obtain a plurality of N-PSK constellation points of the signal. In an aspect, data stream obtaining component 122, e.g., in conjunction with processor(s) 153, memory 155, and/or transceiver 156, can demodulate the received signal (e.g., signal 109) to obtain the plurality of N-PSK constellation points of the signal. For example, communicating component 120 can receive the signal from transmitting entity 102, as described, which can be a signal transmitted in accordance with waveform generation aspects described herein (e.g., by waveform generating component 114, using the method 300 of FIG. 3, etc.). For example, data stream obtaining component 122 can demodulate the signal received by communicating component 120 by using N-PSK demodulation.

Method 600 also includes, at block 604, performing trellis decoding to map the plurality of N-PSK constellation points to a plurality of offset BPSK constellation points. In an aspect, trellis decoding component 124, e.g., in conjunction with processor(s) 153 and/or memory 155, can perform trellis decoding to map the plurality of N-PSK constellation points to the plurality of offset BPSK constellation points. For example, trellis decoding component 124 can utilize a similar decoding mechanism as the encoding mechanism used by trellis coding component 118. For example, performing trellis decoding at block 604 may optionally include, at block 606, determining an offset BPSK constellation point that has a least distance loss for each of the plurality of N-PSK constellation points.

Figure 7:
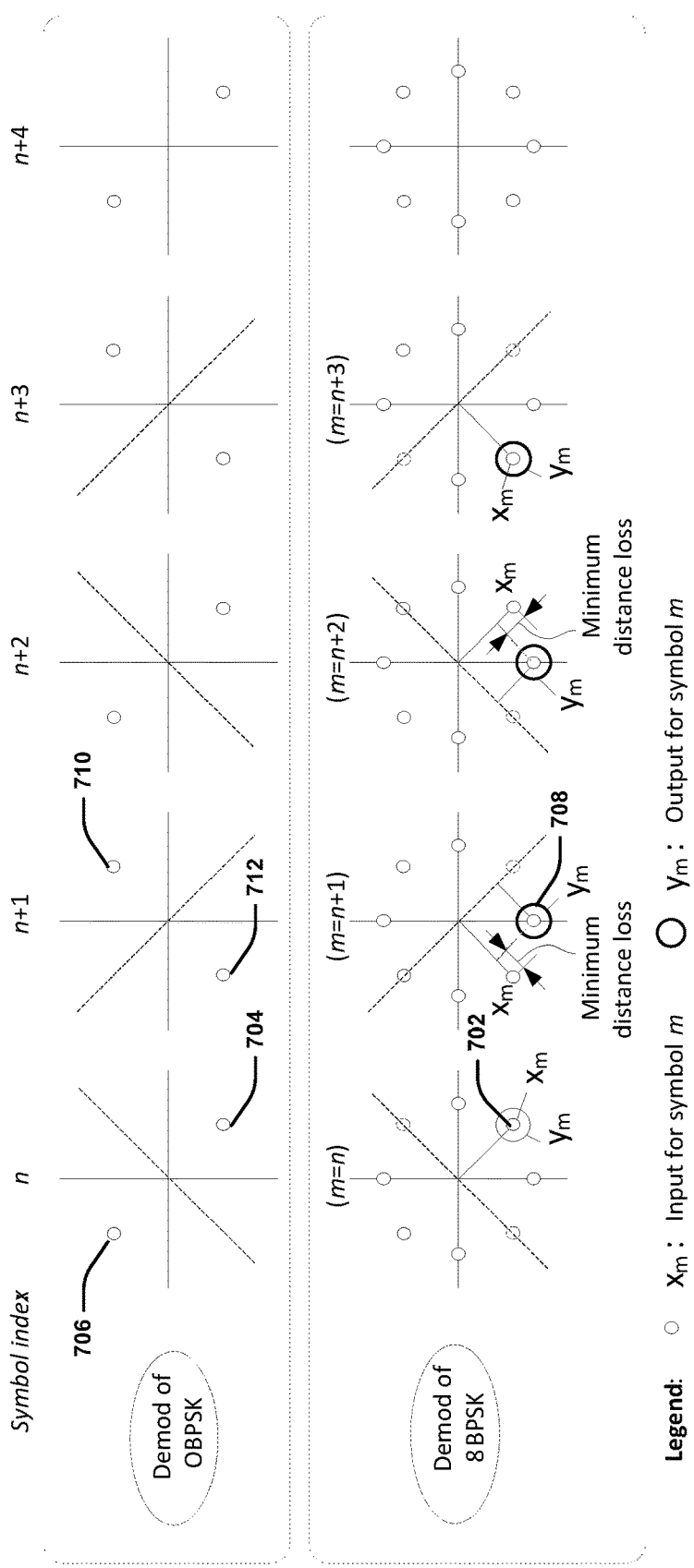
FIG. 7 is a diagram illustrating an example of performing trellis decoding in accordance with aspects described herein.

For example, referring to FIG. 7, trellis decoding component 124 can determine whether a N-PSK constellation point 702 corresponds to a possible offset BPSK constellation point 704 or 706 for the corresponding symbol n. Because N-PSK constellation point 702 is one of the two possible offset BPSK constellation points 704, 706 for symbol n, trellis decoding component 124 can map to the BPSK constellation point 704 for the symbol n. In the next symbol, n+1, trellis decoding component 124 can determine whether N-PSK constellation point 708 corresponds to possible offset BPSK constellation point 710 or 712 for the symbol. Because BPSK constellation point 712 has less distance loss from N-PSK constellation point 708 than BPSK constellation point 710, trellis decoding component 124 can map the N-PSK constellation point 708 to BPSK constellation point 712 for the symbol n+1, and so on for remaining symbols, as depicted in FIG. 7.

The trellis encoding described herein may reduce the minimum distance between constellation points compared to, for example, the offset BPSK signal. This can be observed in FIG. 4, where choosing constellation point 422 results in a reduced minimum distance compared to constellation point 410. In a further example, the receiving entity 104 may overcome the loss resulting from reduced minimum distance by jointly processing a plurality of symbols. For example, when deciding that a bit received is more likely to be '0' or '1', the trellis decoding component 124 may take into account estimates for other bits. For example, for deciding on a bit for symbol n, trellis decoding component 124 may take into account symbols n−1 and n+1.

When received signals propagate through dispersive channels, the multipath may result in the receiving entity 104 observing multiple delayed versions of the same modulation symbol. In an example, trellis decoding component 124 may additionally employ channel equalization techniques to mitigate the multipath effect. An example of an advanced equalization technique, which may be employed by trellis decoding component 124, is a trellis decision feedback equalizer (DFE). In this example, trellis decoding component 124 can determine a likelihood of a bit value for a certain symbol to enhance decisions for other symbols by taking into account the correlation between symbols due to both (or either of) the trellis encoding and/or the effect of multipath.

Method 600 also includes, at block 608, demapping the plurality of offset BPSK constellation points to determine a plurality of bits in a stream of bits of the received signal. BPSK demapping component 126 can demap the plurality of offset BPSK constellation points to determine the plurality of bits in the stream of bits of the received signal. For example, as described above in reference to generating the waveform, each offset BPSK bit in a symbol can correspond to a bit, which can represent data communicated by the received signal. Accordingly, receiving entity 104 can receive and decode the signal received from transmitting entity 102, and utilizing trellis encoding/decoding in this regard allows for achieving a reduced peak-to-average.

Figure 8:
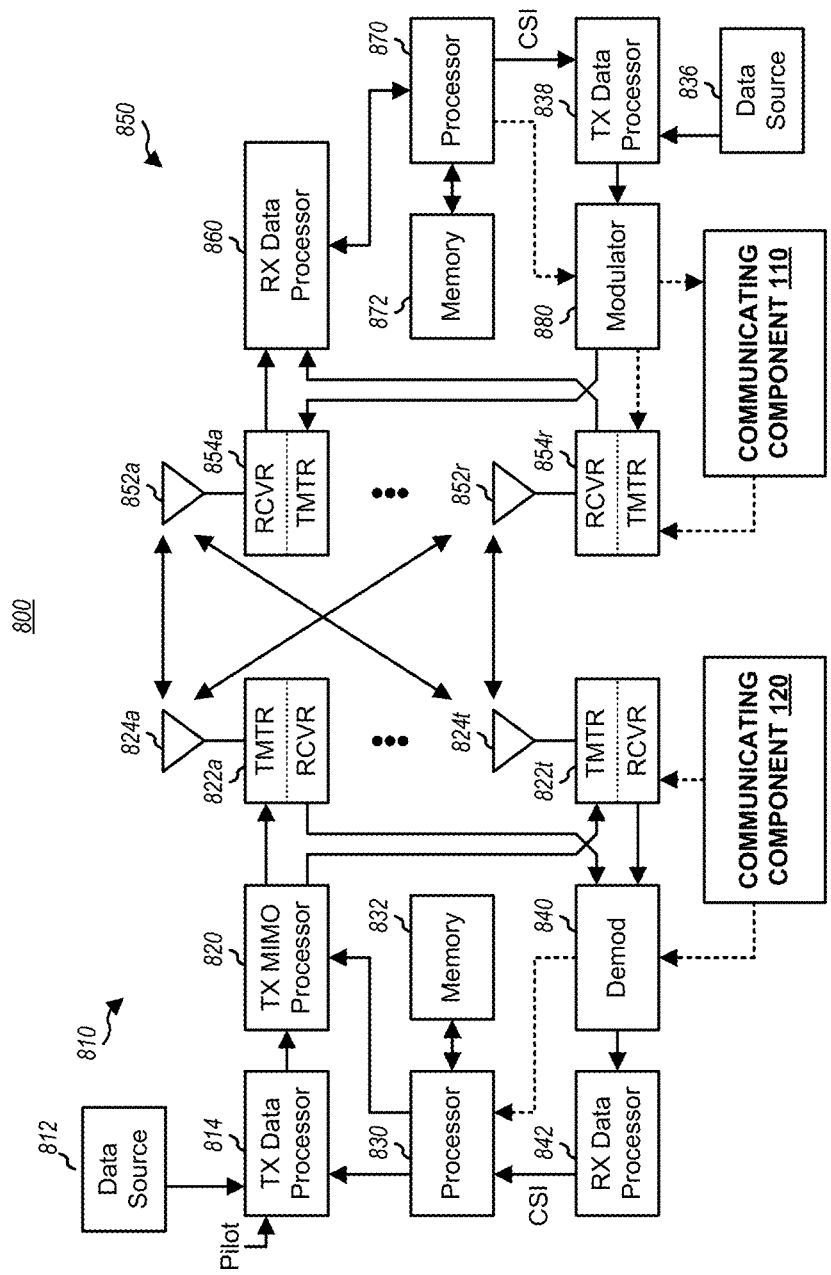
FIG. 8 is a diagram illustrating an example of an evolved Node B and user equipment in an access network.

FIG. 8 is a block diagram of an embodiment of an eNB 810 and a UE 850 in a MIMO system 800. For example, eNB 810 may include a receiving entity 104, and/or one or more components thereof, such as a communicating component 120, as described herein. Similarly, UE 850 may include a transmitting entity 102, and/or one or more components thereof, such as a communicating component 110, as described herein. At the eNB 810, traffic data for a number of data streams is provided from a data source 812 to a transmit (TX) data processor 814.

In an embodiment, each data stream is transmitted over a respective transmit antenna. TX data processor 814 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 830.

The modulation symbols for all data streams are then provided to a TX MIMO processor 820, which may further process the modulation symbols (e.g., for OFDM). TX MIMO processor 820 then provides $N_T$ modulation symbol streams to $N_T$ transmitters (TMTR) 822a through 822t. In certain embodiments, TX MIMO processor 820 applies beamforming weights to the symbols of the data streams and to the antenna from which the symbol is being transmitted.

Each transmitter 822 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 822a through 822t are then transmitted from $N_T$ antennas 824a through 824t, respectively.

At UE 850, the transmitted modulated signals are received by $N_R$ antennas 852a through 852r and the received signal from each antenna 852 is provided to a respective receiver (RCVR) 854a through 854r. Each receiver 854 conditions (e.g., filters, amplifies, and downconverts) a respective received signal, digitizes the conditioned signal to provide samples, and further processes the samples to provide a corresponding "received" symbol stream.

An RX data processor 860 then receives and processes the $N_R$ received symbol streams from $N_R$ receivers 854 based on a particular receiver processing technique to provide $N_T$ "detected" symbol streams. The RX data processor 860 then demodulates, deinterleaves, and decodes each detected symbol stream to recover the traffic data for the data stream. The processing by RX data processor 860 is complementary to that performed by TX MIMO processor 820 and TX data processor 814 at eNB 810.

A processor 870 periodically determines which pre-coding matrix to use (discussed below). Processor 870 formulates a reverse link message comprising a matrix index portion and a rank value portion. Processor 870 is additionally coupled to a memory 872 that may store instructions, parameters, and/or other data related to executing functions described herein (e.g., function of communicating component 110).

The reverse link message may comprise various types of information regarding the communication link and/or the received data stream. The reverse link message is then processed by a TX data processor 838, which also receives traffic data for a number of data streams from a data source 836, modulated by a modulator 880, conditioned by transmitters 854a through 854r, and transmitted back to eNB 810.

At eNB 810, the modulated signals from UE 850 are received by antennas 824, conditioned by receivers 822, demodulated by a demodulator 840, and processed by a RX data processor 842 to extract the reserve link message transmitted by the UE 850. Processor 830 then determines which pre-coding matrix to use for determining the beamforming weights then processes the extracted message. Processor 830 is additionally coupled to a memory 832 that may store instructions, parameters, and/or other data related to executing functions described herein (e.g., function of communicating component 120).

Several aspects of a telecommunications system have been presented with reference to a W-CDMA system. As those skilled in the art will readily appreciate, various aspects described herein may be extended to other telecommunication systems, network architectures and communication standards.

By way of example, various aspects described herein may be extended to other UMTS systems such as W-CDMA, TD-SCDMA, High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

In accordance with various aspects described herein, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described herein. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may be resident in the processing system, external to the processing system, or distributed across multiple entities including the processing system. The computer-readable medium may be embodied in a computer-program product. By way of example, a computer-program product may include a computer-readable medium in packaging materials. Those skilled in the art will recognize how best to implement the functionality described herein depending on the particular application and the overall design constraints imposed on the overall system.

It is to be understood that the specific order or hierarchy of steps in the methods disclosed is an illustration of exemplary processes. Based upon design preferences, it is understood that the specific order or hierarchy of steps in the methods or methodologies described herein may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described herein that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method for generating a waveform for transmitting in wireless communications, comprising:
    obtaining a plurality of bits;
    mapping the plurality of bits to a plurality of offset binary phase shift keying constellation points; and
    performing trellis coding over the plurality of offset binary phase shift keying constellation points to generate a plurality of N-phase shift keying constellation points, wherein N=8, and wherein performing the trellis coding comprises mapping the plurality of offset binary phase shift keying constellation points to one of three possible N-phase shift keying constellation points, based at least in part on three consecutive offset binary phase shift keying constellation points among the plurality of offset binary phase shift keying constellation points, to generate the plurality of N-phase shift keying constellation points;
    generating a plurality of segments of a waveform based at least in part on the plurality of N-phase shift keying constellation points;
    performing an overlap-and-add in at least a signal phase domain at one or more boundaries between the plurality of segments to generate the waveform; and
    transmitting the waveform.

2. The method of claim 1, wherein performing the overlap-and-add comprises applying a windowing function to a signal phase at the one or more boundaries between the plurality of segments.

3. The method of claim 1, wherein generating the plurality of segments of the waveform comprises scaling the plurality of N-phase shift keying constellation points.

4. The method of claim 3, wherein generating the plurality of segments of the waveform comprises pulse shaping the plurality of N-phase shift keying constellation points.

5. The method of claim 4, wherein pulse shaping the plurality of N-phase shift keying constellation points comprises performing at least one of a discrete Fourier transform or an inverse fast Fourier transform on the plurality of N-phase shift keying constellation points.

6. The method of claim 1, wherein performing trellis coding further comprises using the offset binary phase shift keying constellation point of the first bit in the plurality of bits in generating an N-phase shift keying constellation point for the last bit in the plurality of bits.

7. The method of claim 1, wherein the plurality of bits correspond to a single-carrier frequency division multiplexing (SC-FDM) symbol.

8. The method of claim 1, further comprising converting the waveform to an analog signal, wherein transmitting the waveform comprises transmitting the analog signal.

9. The method of claim 1, further comprising performing another overlap-and-add in at least a signal magnitude domain at the one or more boundaries between the plurality of segments.

10. An apparatus for generating a waveform for transmitting in wireless communications, comprising:
    a transceiver;
    at least one processor communicatively coupled with the transceiver via a bus for communicating, via the transceiver, signals in a wireless network; and
    a memory communicatively coupled with the at least one processor and/or the transceiver via the bus;
    wherein the at least one processor is operable to:
        obtain a plurality of bits;
        map the plurality of bits to a plurality of offset binary phase shift keying constellation points; and
        perform trellis coding over the plurality of offset binary phase shift keying constellation points to generate a plurality of N-phase shift keying constellation points, wherein N=8, and wherein the at least one processor is operable to perform the trellis coding at least in part by mapping the plurality of offset binary phase shift keying constellation points to one of three possible N-phase shift keying constellation points, based at least in part on three consecutive offset binary phase shift keying constellation points among the plurality of offset binary phase shift keying constellation points, to generate the plurality of N-phase shift keying constellation points;
        generate a plurality of segments of a waveform based at least in part on the plurality of N-phase shift keying constellation points;
        perform an overlap-and-add in at least a signal phase domain at one or more boundaries between the plurality of segments to generate the waveform; and
        transmit the waveform via the transceiver.

11. The apparatus of claim 10, wherein the at least one processor is operable to perform the overlap-and-add by applying a windowing function to a signal phase at the one or more boundaries between the plurality of segments.

12. The apparatus of claim 10, wherein the at least one processor is operable to generate the plurality of segments of the waveform at least in part by scaling the plurality of N-phase shift keying constellation points.

13. The apparatus of claim 12, wherein the at least one processor is operable to generate the plurality of segments of the waveform at least in part by pulse shaping the plurality of N-phase shift keying constellation points.

14. The apparatus of claim 13, wherein the at least one processor is operable to pulse shape the plurality of N-phase shift keying constellation points at least in part by performing at least one of a discrete Fourier transform or an inverse fast Fourier transform on the plurality of N-phase shift keying constellation points.

15. The apparatus of claim 10, wherein the at least one processor is further operable to perform trellis coding at least in part by using the offset binary phase shift keying constellation point of the first bit in the plurality of bits in generating an N-phase shift keying constellation point for the last bit in the plurality of bits.

16. The apparatus of claim 10, wherein the plurality of bits correspond to a single-carrier frequency division multiplexing (SC-FDM) symbol.

17. The apparatus of claim 10, wherein the at least one processor is further operable to convert the waveform to an analog signal, wherein the at least one processor is operable to transmit the waveform by transmitting the analog signal.

18. The apparatus of claim 10, wherein the at least one processor is further operable to perform another overlap-and-add in at least a signal magnitude domain at the one or more boundaries between the plurality of segments.

19. An apparatus for generating a waveform for transmitting in wireless communications, comprising:
   means for obtaining a plurality of bits;
   means for mapping the plurality of bits to a plurality of offset binary phase shift keying constellation points; and
   means for performing trellis coding over the plurality of offset binary phase shift keying constellation points to generate a plurality of N-phase shift keying constellation points, wherein N=8, and wherein the means for performing the trellis coding performs the trellis coding at least in part by mapping the plurality of offset binary phase shift keying constellation points to one of three possible N-phase shift keying constellation points, based at least in part on three consecutive offset binary phase shift keying constellation points among the plurality of offset binary phase shift keying constellation points, to generate the plurality of N-phase shift keying constellation points;
   means for generating a plurality of segments of a waveform based at least in part on the plurality of N-phase shift keying constellation points;
   means for performing an overlap-and-add in at least a signal phase domain at one or more boundaries between the plurality of segments to generate the waveform; and
   means for transmitting the waveform.

20. The apparatus of claim 19, wherein the means for performing performs the overlap-and-add by applying a windowing function to a signal phase at the one or more boundaries between the plurality of segments.

21. The apparatus of claim 19, wherein the means for generating generates the plurality of segments of the waveform at least in part by scaling the plurality of N-phase shift keying constellation points.

22. The apparatus of claim 21, wherein the means for generating generates the plurality of segments of the waveform at least in part by pulse shaping the plurality of N-phase shift keying constellation points.

23. The apparatus of claim 22, wherein the means for generating pulse shapes the plurality of N-phase shift keying constellation points at least in part by performing at least one of a discrete Fourier transform or an inverse fast Fourier transform on the plurality of N-phase shift keying constellation points.

24. The apparatus of claim 19, wherein the means for performing the trellis coding further performs trellis coding at least in part by using the offset binary phase shift keying constellation point of the first bit in the plurality of bits in generating an N-phase shift keying constellation point for the last bit in the plurality of bits.

25. The apparatus of claim 19, wherein the plurality of bits correspond to a single-carrier frequency division multiplexing (SC-FDM) symbol.

26. The apparatus of claim 19, further comprising means for converting the waveform to an analog signal, wherein the means for transmitting transmits the waveform as the analog signal.

27. The apparatus of claim 19, wherein the means for performing further performs another overlap-and-add in at least a signal magnitude domain at the one or more boundaries between the plurality of segments.

28. A non-transitory computer-readable storage medium comprising computer-executable code for generating a waveform for transmitting in wireless communications, the code comprising:
   code for obtaining a plurality of bits;
   code for mapping the plurality of bits to a plurality of offset binary phase shift keying constellation points; and
   code for performing trellis coding over the plurality of offset binary phase shift keying constellation points to generate a plurality of N-phase shift keying constellation points, wherein N=8, and wherein the code for performing the trellis coding performs the trellis coding at least in part by mapping the plurality of offset binary phase shift keying constellation points to one of three possible N-phase shift keying constellation points, based at least in part on three consecutive offset binary phase shift keying constellation points among the plurality of offset binary phase shift keying constellation points, to generate the plurality of N-phase shift keying constellation points;
   code for generating a plurality of segments of a waveform based at least in part on the plurality of N-phase shift keying constellation points;
   code for performing an overlap-and-add in at least a signal phase domain at one or more boundaries between the plurality of segments to generate the waveform; and
   code for transmitting the waveform.

29. The non-transitory computer-readable storage medium of claim 28, wherein the code for performing performs the overlap-and-add by applying a windowing function to a signal phase at the one or more boundaries between the plurality of segments.

30. The non-transitory computer-readable storage medium of claim 28, wherein the code for generating generates the plurality of segments the waveform at least in part by scaling the plurality of N-phase shift keying constellation points.

31. The non-transitory computer-readable storage medium of claim 30, wherein the code for generating generates the plurality of segments the waveform at least in part by pulse shaping the plurality of N-phase shift keying constellation points.

32. The non-transitory computer-readable storage medium of claim 31, wherein the code for generating pulse shapes the plurality of N-phase shift keying constellation points at least in part by performing at least one of a discrete Fourier transform or an inverse fast Fourier transform on the plurality of N-phase shift keying constellation points.

33. The non-transitory computer-readable storage medium of claim 28, wherein the code for performing the trellis coding further performs trellis coding at least in part by using the offset binary phase shift keying constellation point of the first bit in the plurality of bits in generating an N-phase shift keying constellation point for the last bit in the plurality of bits.

34. The non-transitory computer-readable storage medium of claim 28, wherein the plurality of bits correspond to a single-carrier frequency division multiplexing (SC-FDM) symbol.

35. The non-transitory computer-readable storage medium of claim 28, further comprising code for converting the waveform to an analog signal, wherein the code for transmitting transmits the waveform as the analog signal.

36. The non-transitory computer-readable storage medium of claim 28, wherein the code for performing further performs another overlap-and-add in at least a signal magnitude domain over the pulse-shaped N-phase shift keying constellation points.

* * * * *